United States Patent [19]

Pol

[11] Patent Number: 5,089,545

[45] Date of Patent: Feb. 18, 1992

[54] SWITCHING AND MEMORY ELEMENTS FROM POLYAMINO ACIDS AND THE METHOD OF THEIR ASSEMBLY

[75] Inventor: Alexander T. Pol, Miami, Fla.

[73] Assignee: Biotech International, Inc., Miami, Fla.

[21] Appl. No.: 310,364

[22] Filed: Feb. 12, 1989

[51] Int. Cl.$^5$ .............................................. H01L 31/04
[52] U.S. Cl. ................................ 524/17; 252/62.51; 428/212; 528/363
[58] Field of Search .................... 252/62.50; 524/17; 428/212; 528/363

[56] References Cited

U.S. PATENT DOCUMENTS 4,514,584  4/1985  Fox et al. ............................ 136/263

OTHER PUBLICATIONS

Ishima et al., "Electrical Membrane Phenomena in Spherules from Proteinoid and Lecithin" Bio Systems, 13 (1981) 243-251.

Przybylski "Excitable Cell Made of Thermal Proteinoids" BioSystems, 17 (1985) 281-288.

Primary Examiner—Nathan M. Nutter

[57] ABSTRACT

A chemical method of producing organic switching and memory units for electronic computer elements which comprises the self-assembly of said elements from polyamino acids exclusive of flavin and pterin pigments and mono-amino-dicarboxylic acids, and membranous planar, spherical and tubular structures produced thereby.

7 Claims, 4 Drawing Sheets

SWITCHING AND MEMORY ELEMENTS FROM POLYAMINO ACIDS AND THE METHOD OF THEIR ASSEMBLY

CROSS-REFERENCES TO RELATED APPLICATIONS

This application is related to the Disclosure Document, filed at the U.S. Patent Office in Feb. 11, 1987.

BACKGROUND OF THE INVENTION

The background of the present invention is preceded by description of the field of invention and the state of the art.

FIELD OF THE INVENTION

The invention is related to electronic computer elements and methods of their assembly. In the Specification a chemical method of producing organic switching and memory units, assembled from polyamino acids, is described. Described elements change their electrical polarization due to electrical, chemical and light stimulation.

STATE OF THE ART

Contemporary mechanical assembly of electronic devices has almost reached the limit of possibilities. The Josephson junction may be a good example here: submicron size and switching below femtoseconds has been already achieved. This is an indication that a desire for further miniaturization and three-dimensional package of electronic devices will be fulfilled sooner than we anticipated. Semiconductor technology, after two or three more times doubling in circuit density, will reach the fundamental limits imposed by the laws of physics. New concepts, such as quantum wells and neural circuit architecture in electronic technology, are already being explored (G. M. Borsuk: in Molecular Electronic Devices. Eds. F. L. Carter, R. E. Siatkowski, H. Wohltjen, Elesvier Science Publishers B. V., North Holland, 1988; M. A. Reed: ibidem).

Beyond the recent methods in the technology of computer elements, also theoretical perspectives for the near future technology and some practical assembly attempts of the molecular electronic devices are considered (e.g. Molecular Electronic Devices, Ed. F. L. Carter, M. Dekker, New York, 1982; International Symposium on Molecular Electronics—Biosensors and Biocomputers, Santa Clara, July 19–24, 1988).

However, described and even patented molecular computer elements are rather conceptual only (W. M. M. Biernat: U.S. Pat. No. 3,119,099; A. Aviram, and P. E. Seiden: U.S. Pat. No. 3,833,894). As yet, only some of the fundamental problems relevant to the molecular construction of, for instance NAND and NOR gates (F. L. Carter: in Computer Applications in Chemistry. Eds. S. R. Heller, and R. Potenzone, Elsevier Science Publishers) have been solved (S. W. Staley, J. S. Lindsey, and R. R. Birge: 3rd Internat. Symp. Molecular Electronic Devices, Arlington, VA, Oct. 6–8, 1986).

An emphasis on miniaturization is subject to critical evaluation in that the utilization of individual molecules as functional elements remains elusive (J. B. Tucker: High Technology, Feb., 36, 1984; R. C. Haddon, and A. A. Lammola: Proc. Natl. Acad. Sci. USA, 82, 1874, 1985) despite that macroscopic neuronal impulses and chemical signals in the information processing are based on molecular events.

The prospect of making computer circuits with smaller elements which can even assemble themselves is now in view. Self-assembly seems to be the most challenging aspect involved in designing of molecular electronic devices. The contemporary physical assembly of the electronic elements is going to be replaced by directed chemical assembly. After an implementation of the neuronal network computer architecture, although, as yet, based on conventional semiconductor technology, also consideration of the constituent computing elements, assembled chemically, become an issue. Such practical elements can be achieved through biotechnological approach. Biotechnological research and development toward chemical assembly of computer elements comprise:

a. an use of the ultracytochemistry technique to deposit very thin metal layers in a protein matrix, and b. an orientation of the protein monolayer to a subassembly of macromolecules that form electronic circuits.

The growing importance of metal organic chemical vapor deposition (P. Burggraaf: Semiconductor Internat., Nov., 60, 1986; L. J. Mawst, M. A. Emanuel, M. E. Givens, C. A. Zmudzinski, and J. J. Coleman, Semiconductor Internat., Nov. 60, 1986), already in production practice, is a reflection of an intermediary stage between inorganic and organic technology of computer elements.

The self-assembly aspect of molecular electronic devices, based on controlled organic molecular processes, but not reduced to single molecules, is already a realistic approach (Y. Ishima, A. T. Przybylski, and S. W. Fox: BioSystems, 13, 243, 1981; A. T. Przybylski, W. P. Stratten, R. M. Syren, and S. W. Fox, Naturwissenschaften, 69, 561, 1982; A. T. Przybylski: Biosystems, 17, 281, 1985; A. T. Przybylski, and S. W. Fox: in Modern Bioelectrochemistry, Eds. F. Gutman, and H. Keyzer, Plenum Press, New York, 1986.

BACKGROUND OF THE INVENTION

The protein component is the main functional constituent of the modern biological membranes and also of the lipo-polyamino acid membranes. Lipid membrane by itself is electrically inactive; only a deposition of the protein-like substance results in the emergence of electrical properties of the membrane.

Reported attempts at the assembly of computer elements, based on proteins (J. H. McAlear, and J. M. Wehrung: U.S. Pat. No. 4,103,064; J. S. Hanker, and B. L. Giammara: in Molecular Electronic Devices, Ed. F. L. Carter, M. Dekker, New York, 1982; K. M. Ulmer: ibidem), can be considered as a first successful practical step. We know that intramolecular electron transfer processes take place in protein molecules (M. A. Ratner: Internat. J. Quantum Chem., 14, 675, 1978) and that such transfer processes result in a significant electrical potential between adjacent proteins (G. R. Moore, and R. J. P. Williams: Coordin. Chem. Revs., 18, 125, 1976). This potential is especially high across the membrane (P. C. Hinkle: Fed. Proc. 32, 1988, 1973. As a potential (gradient of various modality energy or substance concentration) is applied across the lipo-protein membrane, the voltage appearing across the effective membrane is equal for charging $$V(t) = V_0[1 - \exp-(t/RC)]$$

and for discharging $$V(t) = V_0[\exp - (t/RC)],$$

where:
- $V_o$—maximum potential across the membrane,
- R—membrane resistance,
- C—membrane capacitance.

It is known that in neurons and nerves there are practically no nucleic acids, and the membrane of depleted protoplasm from the axon is able to generate and conduct electrical impulses during a long time. That means that nucleic acids are not consituents of the structure responsible for the impulse generation. An appearance of the charge transfer and electrical potential across pigmented membranes has been well documented both theoretically and experimentally (F. T. Hong: Photochem. Photobiol., 24, 155, 1976). As there is some evidence that proteins have semiconductor properties (F. Gutman: in Modern Bioelectrochemistry, Eds. F. Gutman, and H. Keyzer, Plenum Press, New York, 1986), there is a reason to assume that light may be used to switch the molecular state and the transmembrane potential in the case of the lipo-protein membranes. The optical computing is, therefore a realistic approach when the computer elements consist of proteinaceous material containing chromophores.

It has been suggested, and we have some data, that assembled polypeptides would provide a basis for an active molecular electronic devices. Proteins are the most plausible compounds for the computer-like material. The kinase-phosphatase system displaying storage and switching features (J. E. Lisman: Proc. Natl. Acad. Sci. USA, 82, 3055, 1985) and the enzymatic transistor (B. Danielsson, K. Mosbach, I. Lundstrom, and L. Stilbert: Enzyme Engineering, 5, 123, 1980) are embodiments which indicate for practical possibility for finding a chemical basis for these phenomena. Directed self-assembly of designed functional compounds with expected properties has the best change of success on peptide or protein materials.

Electrical switching has been observed in melanin (J. McGinnes, P. Corry, and P. Proctor: Science, 183, 835, 1974).

SUMMARY OF THE INVENTION

Directed chemical self-assembly of the switching and memory elements, based on polyamino acids, is an objective of the invention.

The invention concerns chemical preparation of such polyamino acids containing lipids and dyes as well as assembly of membraneous planar, spherical and tubular structures. Synthesis of said polyamino acids comprises thermal condensation and sequential synthesis of amino acids and formation of intrinsic chromophores or addition of dyes to the polymers.

Assembly of the switching and memory structures comprises dissolving of the obtained polymer material, addition of ions and evaporation of the solvent. Assembled structures hold electrical trans-membrane potential, which can be switched by electrical, chemical or photic impulses.

DESCRIPTION OF THE INVENTION

The material of the polymers of amino acids has been obtained by thermal condensation and by a hybrid sequential-thermal synthesis. The hybrid method of thermal copolymerization and sequential coupling of amino acids and fragments of amino acid monomers results in polymers having side chains and strict sequence of amino acid residues. The described method of hybrid sequential-thermal synthesis of polyamino acids [A. Pol: U.S. Patent pending] provides combinations of all amino acid residues in the polymers under the condition that:

a. tri-functional amino acids are present during the stage of thermal polymerization, and b. various method of protection of the active amino acid groups are applied.

If the sequential synthesis results in linear chain of amino acid residues, the thermal polymerization determines higher dimensional order of the polymer.

Prepared polymers have a general formula

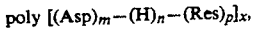

poly $[(Asp)_m-(H)_n-(Res)_p]_x$, where H denotes a hydrophobic amino acid, Res—other amino acid residues and m, n, p, x—numbers, contingent upon the polymerization conditions, can vary from 10 to 1000.

The presence of tri-functional amino acids during their copolymerization prevents formation of diketopiperazines and results in predominantly alpha-peptide bonding of the polymers having total molecular weight up to 10,000.

In all polyamino acids, produced thermally, aspartic and glutamic acids are necessary components.

The polymers and their aggregation products contain flavin and pterin chromophoric groups (J. Hartman, M. C. Brandt, and K. Dose; BioSystems, 13, 141, 1981), produced intrinsically during polymerization and partial thermolysis of constituent amino acids. They posses also anisotropic properties (B. Heinz, and W. Ried: 7th Internat. Conf. Origin of Life, Mainz, July 10–15, 1983). As a result, the polymers, as well as planar and spherical membranes, made from them, are photosensitive (S. W. Fox, and A. T. Przybylski: U.S. Pat. No. 4,514,584) revealing considerable size of photovoltaic potential (up to 1 volt) and low current (up to 100 nA/cm$^2$): FIG. 1.

Understanding of the described embodiments of the disclosed switching and memory structures will be better explained by use of the following drawings.

DESCRIPTION OF THE PREFERRED EMBODIMENTS

Figure 1:
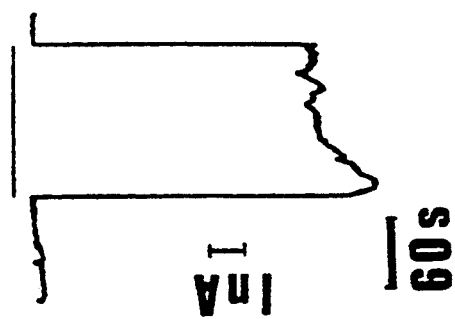
FIG. 1. Photovoltaic response of the proline-rich polyamino acid—eosine system during illumination by a quartz lamp of 200 lux intensity (horizontal bar). Calibrations: 1 nA and 10 mV; 1 min.

The preferred embodiments of the invention are presented on two Examples: one describing synthesis of the polymers, and the second one describing the self-assembly of the membraneous structures of the switching and memory elements.

Synthesis of the polymers may be illustrated on the following example.

EXAMPLE 1

The polymer containing aspartic acid and tryptophan residues is synthesized according to the following procedure.

1. Initial thermal condensation of aspartic acid with tryptophan. Thermal copoly(Asp-Trp) monomer is obtained during thermal condensation of Asp and Trp with unprotected active groups

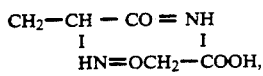

which is condensed further in order to couple obtained monomers.

Practical process of thermal condensation is very simple. Equimolar mixtures of L-aspartic acid and L-tryptophan are heated under nitrogen atmosphere at 200° C. 6 hours, or at 60° C. during several days. Obtained product is dialyzed through the 3,000 molecular weight cut-filter and further lyophilized. After its HPLC purification and analysis the final product is subject to the further process in the hybride synthesis.

If required, the process of copolymerization can be preceded by thermal homopolycondensation in the initial stage of the synthesis. In this case poly(Asp) submonomers are synthesized

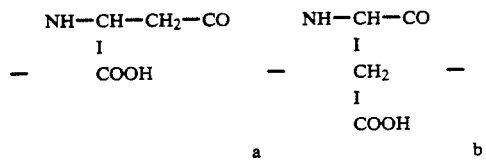

Then, further copolymerization results in the following copolymers

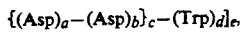

where a, b, c, d and e—are integers contingent upon conditions of the polymerization.

The sam steps of polymerization, but with protecting of the active amino acid groups result in polymers of different structure.

2. Protection of the desired active amino acid groups of aspartic acid and tryptophan and sequential synthesis through the remaining active groups, followed by deprotection of the protected groups, and subsequent 3. Thermal copolycondensation of aspartic acid and tryptophan.

Protection of the active amino acid groups (aspartic acid and tryptophan) are realized through the following reactions: blocking of the side chain carboxyl groups of aspartic acid in two steps:

a) through L-aspartic acid -beta-benzyl ester (beta-benzyl)-L-aspartate) and b) through benzyloxycarbonyl-L-aspartic acid-beta-benzyl ester (beta-benzyl benzyloxycarbonyl-L-aspartate).

The process of the hybrid synthesis is accomplished by the:

a/ combination of the sequential synthesis and thermal condensation of the amino acids in the described process and is determined by the amino acid composition of the mixture and their molar ratio, b/ sequence of the steps of the process of the synthesis, and c/ protection of the active groups of the constituent amino acids.

Assembly of the switching and memory structural elements is performed during the following steps:

The product of thermal copolymerization of amino acids, dissolved in pure water, electrolytes containing such ions as sodium, potassium, calcium, magnesium, chloride, phosphate and their combination as well as in water containing other compounds and solvents produces bilayer or multilayer membraneous planar and spherical structures.

Evaporation take place during the heating or sonication procedure, followed by a passive evaporation during deposition of the polymer material on the flat surface.

The vesicles are round, of several micrometers in size. Also tubules, of a diameter of several micrometers are produced. The form of the structures is dependent upon amino acid composition within the polymers and content of the lipid component. The lipid component is a modifying component, and its presence in the membrane is not a sine qua non requirement of the membrane components. It can be added initially to the mixture of the ingredients before their dissolving and heating. Depending on amino acid composition of the constituent polymer, its ionic environment and the presence of phospholipids, the size of vesicles varies. As a rule, the presence of lecithin results in enlargement of diameter of the vesicles. Multilayer membranes are formed in the presence of added lipids to the polymers in various ratio. Several layer membranes are formed when the polymer-lipid ratio is around 10:1.

EXAMPLE 2

Self-assembly of spherical structures having double membrane and and considerable trans-membrane electric potential around 45 mV, is illustrated below.

A suspension of 60 mg of the polymer and 60 mg of lecithin are dissolved in 3 ml of potassium phosphate solution with aqueous glycerol is heated to boiling. The aqueous electrolyte contains the following amounts of ions: K—80, H—130, Na—0.2, K—0.05, Mg—0.1, Ca—0.5, Cl—0.25, PO$_4$—70, NO$_3$—1.0 and SO$_4$—0.1 mM.

An electron donor or electron acceptor type of dyes can be added to the polyamino acid before dissolving of the mixture and its heating. Also ultraacoustic sonication can be applied instead of heating the mixture.

Single vesicles are arranged into:

a/ chains by making a common bridging communication channels between individual entities through their membranes;

b/ outgrowing processes from individual vesicles;

c/ two-dimensional hexagonal packaging and physical contact through the external parts of their membranes.

Single vesicles can be arranged into chains. They touch each other only membrane to membrane, make a common communication within the inside, or they form branched processes. Tubular structures are formed in the case of the presence of hydrophobic amino acids within the polymers. Structures with outgrowing processes are formed when the polyamino acids contain tryptophan.

Hexagonal packaging of vesicles is accomplished in such a mode that all membraneous elements are in a mutual contact being attached to each other through their surfaces on 1/6 parts of their 2- or 3-dimensional entities.

The intrinsic zwitterionic properties of the constituent amino acids within the polymer determine the dipole and charge-orientation of the resultant microstructures. Beyond protein bond, the presence of flavin and pterin chromophoric groups in the polymer directly response to the electromagnetic stimulation of the membrane and change of its electrical polarization.

Subject of the present disclosure differs significantly from already published data by the same author. The previous data were obtained using only polyamino acids, obtained exclusively by thermal condensation, and the assembled structures (both planar and spherical), although displayed some membrane potential and some resemblance to neuronal electrical discharges, were far from the clear and controllable switching and memory effects.

The described hybrid technique of sequential synthesis and thermal condensation of amino acids enable this kind of polyamino acids and their assembly into such elements.

In contradistinction to the material of the previous papers, where all polymers of thermal condensation are considered to be random of only their amino acid composition known, in the present Specification, not only a desirable composition of the resultant polymers but also the amino acid composition and arrangement of the functional chemical groups is accomplished by the described method of the hybrid sequential-condensation process of amino acids. This is a crucial difference both in the applied methods and resulting products. Such hybrid process of polymerization of amino acids but not been described as yet.

The described findings on electrical phenomena in the previous publications (Ishima et al., 1981) and Przybylski (1985) were obtained on such non-directed (or random) polymers and were far from being a subject of engineered features associated with such polymers.

The difference between the subject material, described in the present Specification as compared to the material in the previous papers is the following. In the first paper the only the uncontrolled flip-flop phenomena and spontaneous oscillations across the protein-like material with lecithin were described. In the second one, some phenomena such as negative dynamic resistance and hysteresis resembling both some technical semiconductive devices and natural neurons were found. The data of the last paper provided a ground for further theoretical and experimental approach toward chemical assembly of the organic controllable switching spherical and planar membranes. The controllable switching phenomena, described in the Specification, were obtained only in structures assembled from the polymers, obtained in the hybrid process of sequential synthesis and thermal condensation of amino acids.

Additionally, an ion concentration gradient across the membrane, a membrane polarization contribute to the size of the trans-membrane electrical potential and its change during applied electrical, chemical or photic stimuli. The electrical potential across the membrane is directly proportional to the intra-vesicle content of potassium ions. The subthreshold gradual change of the trans-membrane potential result into a dynamic depolarization potential of equal amplitude. Electrically induced potentials are produced when gradually increased injection current reaches the threshold value. There is asymmetry of the response.

Figure 2:
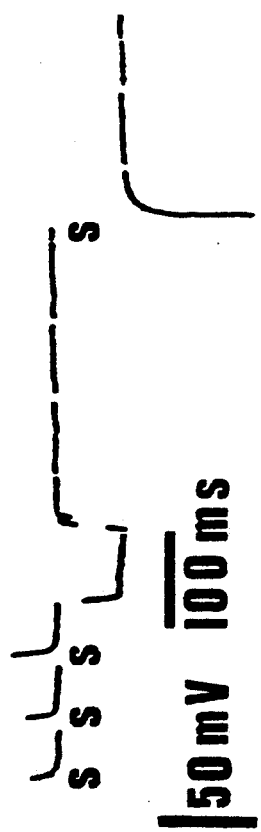
FIG. 2. Switching of the transmembrane electrical polarizaition of the spherical structure made from the polyamino acid—phospholipid compounds during electrical stimulation by positive 2 V impuls. No effect by the same polarity impuls of the lower voltage of 1.0 and 1.5 V, as well as to negative impulse of 2 V.
Figure 3:
FIG. 3. Dependence of the initial level of the transmembrane electrical polarization of the structure, composed of polyamino acid-dye system, upon the direction of the switching effect by light stimulus (arrow).
Figure 4:
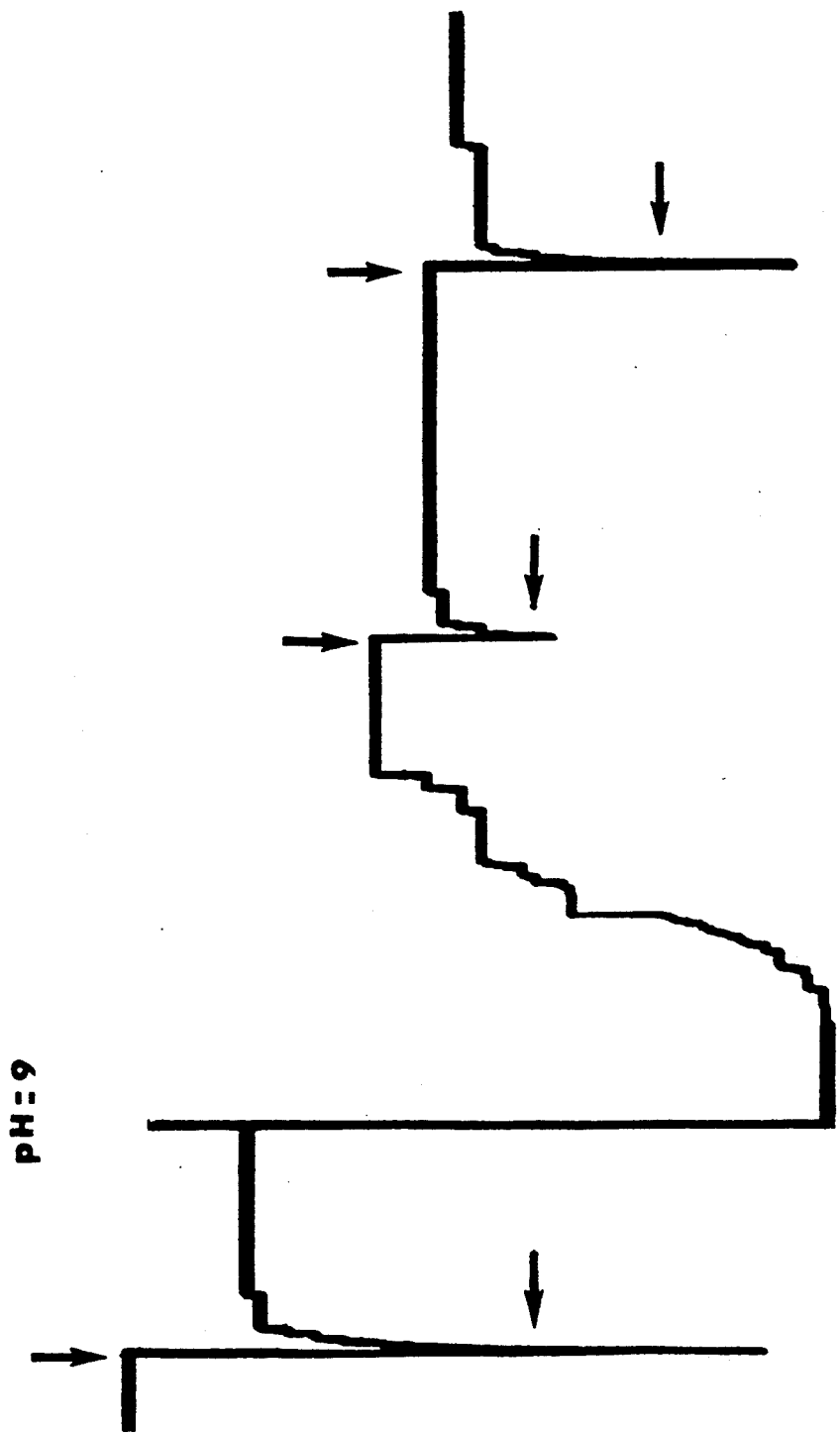
FIG. 4. Influence of the chemical stimulus on the electrical potential of the membrane of the systems consisting of polyamino acid and dye. Effect of the change of pH of the system on the photovoltaic switching effect before and after subsequent optical stimuli (arrows).

The polyamino acid vesicles behave quite linearly and reveal regular alternating switching phenomena when stimulated electrically. The switching is obtained only due to one polarity of applied stimuli. Stimuli of an opposite polarity do not reverse the trans-membrane potential (FIG. 2). The photovoltaic switching of the membrane potential during illumination by visible and UV light is produced. The degree of the effect and its prolongation are proportional to the intensity and duration of the illumination. Depending on the initial level of polarization of the polymer-dye interface positive or negative photovoltaic shifts are measured: the negative shift is a result of light stimulation on the positive polarity background, and vice versa (FIG. 3). Descending or ascending potential shift is also pH-dependent (FIG. 4). This is correlated with opposite band splitting of poly-methyl-L-glutamate (M. Goodman, S. A. Verdini, S. Nam, and Y. Masuda: in Topics in Stereochemistry. Eds. E. E. Eliel, and N. L. Allinger, Wiley-Interscience, New York, 1970). The long-lasting relaxation of the induced photovoltaic effect at the polymer-dye interface, especially in the case of the prolinerich polymers, is due to the transformation of poly-L-proline I into its II form (J. Engel: Biopolymers, 4, 945, 1966).

Conformational changes of the protein-like macromolecules associated with ionic permeability across the polymer membrane is the main cause of the described electrical phenomena. The current-voltage characteristics of the membrane, the negative dynamic resistance of the hysteresis are functionally crucial properties of the membraneous structures, assembled from polyamino acids.

There are certain important similarities between in the described structures and natural excitable cells: RC-time constants, depolarization and repolarization, trans-membrane potential and the potassium concentration dependence.

Although the invention has been shown and described on examples of the preferred embodiments, various forms of the content of these embodiments can be realized by one skilled in the art without departing from the scope of the invention, which can be determined by the following claims.

The subject matter of the Specification is restricted to polyamino acids, excluding monoaminoacids, as regard the Claims of the present application versus these of the U.S. Pat. No. 4,514,584, the following negative limitation is made: exclusive of flavin and pterin pigments and mono amino dicarboxylic acids.

What is claimed is:

1. A method of directed chemical self-assembly of electronic switching and memory elements from polyamino acids exclusive of flavin and pterin pigments and mono amino dicarboxylic acids consisting of:

the process of amino acid polymerization by a hybrid sequential synthesis and thermal condensation, mixing the polymer with lipids and dyes, dissolving said compounds in a solvent containing ions, evaporation of the excess of external solvent and formation of planar, spherical and tubular membraneous structures.

2. Membraneous planar, spherical and tubular structures, assembled from components containing essentially polyamino acids, lipids and chromophores and electrolyte environment and sustaining electrical polarization of their membranes, which can be changed by electrical, chemical and photic stimuli.

3. Structures according to claim 2, combined together by tubular bridges.

4. Structures according to claim 2, combined together by external parts of their membranes in a hexagonal package.

5. Structures according to claim 2, with branching processes from them.

6. Structures according to claim 2, characterized by the negative dynamic resistance of their membranes.

7. Structures according to claim 2, characterized by hysteresis of the current-voltage response of their membranes to electrical, chemical and optical stimulation.

* * * * *